United States Patent
Amritphale et al.

(10) Patent No.: US 10,165,713 B2
(45) Date of Patent: Dec. 25, 2018

(54) ADVANCED NON-TOXIC RADIATION SHIELDING MATERIALS FROM TAILORED BRINE SLUDGE AND A PROCESS FOR THE PREPARATION THEREOF

(71) Applicant: COUNCIL OF SCIENTIFIC & INDUSTRIAL RESEARCH, New Delhi (IN)

(72) Inventors: Sudhir Sitaram Amritphale, Bhopal (IN); Avneesh Anshul, Bhopal (IN); Sarika Verma, Bhopal (IN); Mohammed Akram Khan, Bhopal (IN); Satyabrata Das, Bhopal (IN)

(73) Assignee: Council of Scientific & Industrial Research, New Dehli (IN)

( * ) Notice: Subject to any disclaimer, the term of this patent is extended or adjusted under 35 U.S.C. 154(b) by 125 days.

(21) Appl. No.: 15/449,088

(22) Filed: Mar. 3, 2017

(65) Prior Publication Data

US 2017/0257987 A1   Sep. 7, 2017

(30) Foreign Application Priority Data

Mar. 3, 2016   (IN) .............................. 201611007475

(51) Int. Cl.
G21F 1/00 (2006.01)
G21F 3/04 (2006.01)
H05K 9/00 (2006.01)

(52) U.S. Cl.
CPC .............. *H05K 9/0003* (2013.01); *G21F 1/00* (2013.01); *G21F 3/04* (2013.01); *H05K 9/0086* (2013.01)

(58) Field of Classification Search
None
See application file for complete search history.

(56) References Cited

U.S. PATENT DOCUMENTS

| | | | | |
|---|---|---|---|---|
| 4,124,459 A | * | 11/1978 | Blanch | C22B 7/04 205/527 |
| 4,381,288 A | * | 4/1983 | Weiss | C01G 13/00 210/901 |
| 6,405,663 B1 | * | 6/2002 | Jones | F23G 5/008 110/223 |
| 2007/0021936 A1 | | 1/2007 | Marovitz | |
| 2017/0057868 A1 | * | 3/2017 | Amritphale | C04B 18/0418 |

FOREIGN PATENT DOCUMENTS

WO    93/05246 A1    3/1993

* cited by examiner

*Primary Examiner* — Mary Lynn F Theisen
(74) *Attorney, Agent, or Firm* — Baker & Hostetler LLP

(57) ABSTRACT

Conventional shielding materials are based on single material either toxic lead or barium based compounds and any matrix made therefrom contains only single phased barium based compounds, thereby posing limited radiation shielding capacity. Since brine sludge, an industrial toxic waste product, generated in chloralkali industry contains multiple compounds; there is a need to provide a process which enables the preparation of multi-phase based radiation shielding materials. In view of the above, the present invention provides advanced non-toxic radiation shielding materials utilizing tailored brine sludge and a process that enables conversion of toxic elements like chromium, zinc, copper and vanadium present in brine sludge into non-toxic shielding phases, thereby enabling to convert a toxic waste material into highly value added advanced radiation shielding materials possessing homogeneous radiation shielding matrix.

3 Claims, No Drawings

ADVANCED NON-TOXIC RADIATION SHIELDING MATERIALS FROM TAILORED BRINE SLUDGE AND A PROCESS FOR THE PREPARATION THEREOF

CROSS REFERENCE TO RELATED APPLICATIONS

This application claims priority to Indian Patent Application No. 201611007475, filed on Mar. 3, 2016, the disclosure of which is incorporated by reference in its entirety.

FIELD OF THE INVENTION

The present invention relates to advanced non-toxic radiation shielding materials prepared from tailored brine sludge. The invention further relates to a process for the preparation of the said radiation shielding materials comprising heat treatment of brine sludge followed by mechano chemical reactions. The developed materials find application in the areas of radiation shielding applications including diagnostic radiation shielding installations such as in X-ray and CT scanner rooms.

BACKGROUND OF THE INVENTION AND DESCRIPTION OF PRIOR ART

The increase in human population is forcing industrial development which is inherently associated with the drawbacks of generation of hazardous and toxic wastes. Further, the recent stringent rules and regulations for safe environment are forcing materials scientists to convert these industrial toxic waste in to non-toxic and useful form and to develop novel processes for making highly value added advanced non-toxic radiation shielding materials from these wastes for broad application spectrum.

Conventional shielding materials are based on single material which is selected from either toxic lead or barium based compounds. The conventional shielding matrix contains only single phased barium based compounds, therefore posing limited radiation shielding capacity. Since brine sludge contains multiple compounds namely barium sulphate, calcium carbonate, magnesium hydroxide, sodium chloride, clay, therefore I is possible to make multi compound based radiation shielding materials possessing increased radiation shielding capacity therefrom.

The application of radiation based technology is increasing day by day exponentially all over the world and this technology utilizes complete spectrum of radiations ranging from a) Far infrared b) Infra red c) Microwaves d) EMI radiations from mobiles e) X-rays f) Gamma radiation. However, the uses of radiations are associated with very well established deadly harmful effects of radiation to the human beings and therefore there is an urgent need to develop advanced radiation shielding materials preferably cost effective by utilizing waste material as the resource material for the same.

The increase in human population is forcing industrial development which is inherently associated with the drawbacks of generation of hazardous and toxic wastes. Further, the recent stringent rules and regulations for safe environment are imposing materials scientists to convert these industrial toxic wastes into non-toxic and useful form and if possible develop novel processes for making highly value added advanced non-toxic radiation shielding materials therefrom for broad application spectrum.

Brine sludge is an industrial toxic waste generated in chloral alkali industry. The chloralkali process is the main process for manufacturing of caustic soda and chlorine production all over the world. In India a total of almost 36 chloralkali plants are in operational form and Brine mud generation is around 30 kg per ton caustic soda in India, which is more than double the international average. The chloralkali plants in India date back to 1959 by Dharangadhra Chemical Works (DCW) in Tamil Nadu.

In chloralkali industry, the production of NaOH and chlorine is carried out by the electrolysis of purified brine solution i.e 30% sodium chloride solution and the process of purification of impure brine solution involves removal of sulphate and chloride salts of magnesium and potassium. Removal of sulphate species is carried out by adding barium carbonate, which is expensive and leads to the generation of toxic brine sludge waste containing barium sulphate. The removal of chloride species is carried out by adding sodium carbonate leading to the generation of brine sludge containing calcium carbonate and magnesium hydroxide. The generated brine sludge waste is dumped into landfills and the brine sludge waste contains barium sulphate, calcium carbonate, magnesium hydroxide, sodium chloride, clay and toxic elements like chromium, zinc, copper and vanadium thus posing environmental threat. Therefore, there is an urgent need to convert a) toxic brine sludge waste into its non-toxic form and preferably to develop a novel process for the preparation of advanced materials while ensuring total utilization of brine sludge all over the world.

Reference may be made to the article "Characteristic change of effluent from a Chloralkali Industry of India due to process modification" by SubrataBasu et al. in International Research Journal of Environment science. 2013. vol. 2(2), pp. 44-47 wherein the use of brine sludge for making compost and fertilizer is suggested. The drawback of the article is that this application does not rule out the possibility of long term leaching out of toxic elements from the material made using brine sludge.

Reference may be made to the article "Utilization of Brine Sludge in Non-structural Building components: A Sustainable Approach" by Mridul Garg and Aakanksha Pundir in Journal of Waste Management, vol. 2014, Article ID 389316, 7 pages, wherein brine sludge has been utilized for making low value items like bricks and paver blocks using conventional cement and fly ash. However, the drawbacks of the cited process are that the brine sludge has been used in conjunction with cement and fly ash for making only paver blocks and bricks with only 35% i.e. minimal utilization of brine sludge. Thus, the problem of utilization of 65% brine sludge still remains. Further, the toxic elements present in the brine sludge have not been stabilized in cement matrix by forming any chemical linkages with the toxic elements. Hence, there is no assurance of non-leaching of the toxic elements in the environment from the prepared bricks and paver blocks. Since the brine sludge has not been converted into nano size and in functionalized form, therefore it poses limited application in making paver blocks and brick materials only. Additionally, the developed process is based on the age old concept of stabilization of industrial waste into low value added materials to somehow address the problem of disposal and utilization of waste. The process does not teach the use of any advance synthesis technology for making value added materials so as to meet the challenges and stringent rules and regulations of environmental protection Act to address the problem of utilization of industrial toxic wastes.

Reference may be made to CN101823738 where in a method for obtaining fine calcium carbonate and sodium silicate using light magnesium carbonate from chloralkali brine sludge has been reported. The drawbacks of the process are that it involves multi steps, is energy intensive and leads to the increase in pollution load as the brine sludge is not used in totality.

Reference may be made to CN101823822A, wherein hydrochloric acid is used for purifying precipitates of calcium carbonate and calcium sulphate left after the production of light magnesium carbonate. The drawbacks of the process are that it involves multi steps, is energy and equipment intensive and leads to the increase in pollution load as the brine sludge is not used in totality.

Further, from the reported prior art it is evident that total utilization of brine sludge for making highly value added advanced non-toxic radiation shielding material has not been pursued so far. From the hitherto reported prior art and based on the drawbacks of the known process, the various issues that need to be addressed and problems to be solved for ensuring total utilization of toxic brine sludge for making highly value added advanced non-toxic radiation shielding materials are summarized here as under:—

- The brine sludge is toxic and therefore, it creates threat to the environment by remaining unutilized.
- Crores of rupees can be saved by developing value added advanced non-toxic radiation shielding materials by a process that ensures total utilization of toxic brine sludge.
- As it contains very useful and expensive precursor chemical compounds such as barium sulphate, magnesium hydroxide and calcium carbonate, therefore brine sludge can be used as a resource material and can find application in making highly value added a) advanced non-toxic radiation shielding materials b) geo polymeric materials and c) advanced chemically designed composite (ACDC) materials by utilizing unique characteristics of chemical compounds inherently present in brine sludge.
- The brine sludge waste so far has limited application and that too in making low value items e g. paver block and brick materials only.
- Literature reports the use of brine sludge in making fertilizers. However, it is associated with long term environmental hazards.

Thus, keeping in view the drawbacks of the hitherto reported prior art, the inventors of the present invention realized that there exists a dire need to provide advanced non-toxic radiation shielding materials utilizing tailored brine sludge and a process that enables conversion of toxic elements like chromium, zinc, copper and vanadium present in brine sludge into non-toxic shielding phases, thereby enabling to convert a toxic waste material into highly value added advanced radiation shielding materials possessing homogeneous radiation shielding matrix.

OBJECTS OF THE INVENTION

The main object of the present invention is thus to provide advanced non-toxic radiation shielding materials from tailored brine sludge.

Another object of the present invention is to provide a process for the preparation of advanced non-toxic radiation shielding materials from tailored brine sludge.

Still another object of the present invention is to provide a process wherein mechano-chemical activation of heat treated brine sludge is done for obtaining tailored brine sludge.

Yet another object of the present invention is to obtain radiation shielding phases by chemically designing and mineralogically formulating compositions based on various precursors of chemicals present in brine sludge.

Still another object of the present invention is to provide a process which enables synergistic and simultaneous chemical reactions among the various components inherently present in the raw materials.

Yet another object of the present invention is to provide a process which converts toxic elements like chromium, zinc, copper and vanadium, present in brine sludge into non-toxic form.

Still another object of the present invention is to provide a process wherein toxic brine sludge waste is converted into a highly value added advanced non-toxic radiation shielding materials possessing homogeneous radiation shielding matrix.

Yet another object of the present invention is to ensure total utilization of toxic brine sludge waste.

SUMMARY OF THE INVENTION

In the present invention, advanced non-toxic radiation shielding materials have been developed which involves complete utilization of tailored brine sludge. The process for the preparation of the said advanced non-toxic radiation shielding materials comprises drying of brine sludge in an air oven followed by reheating thereof in a furnace. The heat treated brine sludge so obtained is further mechano-chemically processed by grinding with sodium hexametaphosphate in a ball mill or planetary mill etc. The tailored brine sludge powder thus obtained is further compacted in a steel mold using hydraulic pressure in the form of tiles to obtain the desired advanced non-toxic radiation shielding materials.

The developed process enables:
a) designing of raw materials and processing parameters which enable synergistic and simultaneous chemical reactions among the various reactants of the chemical precursor of brine sludge which includes barium sulphate, magnesium hydroxide, calcium carbonate, sodium chloride, silica and aluminum containing compounds necessary for developing highly efficient shielding phases leading to homogenous matrix of shielding materials.
b) Mechano-chemical activation of heat treated brine sludge for obtaining tailored brine sludge useful for developing homogeneous advanced radiation shielding materials.
c) Obtaining shielding phases by chemical designing and mineralogically formulating compositions based on various chemical precursors inherently present in brine sludge.
d) Simultaneous synthesis of desired multi elemental, multi phased, shielding material leading to preparation of homogeneous shielding matrix.
e) The developed process also enables conversion of toxic elements like chromium, zinc, copper and vanadium present in brine sludge into highly value added advanced radiation shielding materials possessing homogeneous radiation shielding matrix.

In an embodiment of the present invention, drying of 200 g to 600 g of brine sludge is done in an air oven at 100 to 110° C. for a period of 1 to 2 hours.

In another embodiment of the present invention, further heating of the brine sludge is done in a furnace in the temperature range of 800 to 1300° C. for a period of 1 to 2 hours.

In yet another embodiment, the present invention provides a process wherein the heat treated brine sludge so obtained is further mechano-chemically processed by grinding with 20 g to 60 g of sodium hexametaphosphate in a ball mill or planetary mill etc. for a period of 1 to 6 hours.

In still another embodiment of the present invention, the tailored brine sludge powder so obtained is further compacted in a steel mold, using hydraulic pressure in the range of 100 to 300 kg/cm$^2$ preferably in the form of tiles of dimensions 10 cm×10 cm×5-10 mm to make advanced non-toxic radiation shielding materials.

In yet another embodiment, the present invention provides advanced non-toxic radiation shielding materials comprising:
[a] 200 g to 600 g of brine sludge;
[b] 20 g to 60 g of sodium hexametaphosphate.

In still another embodiment, the present invention provides a process for the preparation of advanced non-toxic radiation shielding materials comprising drying of 600 g of brine sludge in an air oven at 110° C. for a period of 2 hours followed by heating in a furnace in the temperature range of 1300° C. for a period of 2 hours. The heat treated brine sludge so obtained was further mechano-chemically processed by grinding with 60 g of sodium hexametaphosphate in a ball mill or planetary mill etc. for a period of 6 hours and the tailored brine sludge powder so obtained was further compacted in a steel mold, using hydraulic pressure in the range of 300 kg/cm$^2$ in the form of tiles of dimensions 10 cm×10 cm×10 mm to make advanced non-toxic radiation shielding materials.

In yet another embodiment, the present invention provides a process for the preparation of advanced non-toxic radiation shielding materials, wherein the steps comprising:
 a) Drying of 200 g to 600 g of brine sludge in an air oven at 100 to 110° C. for a period of 1 to 2 hours.
 b) Heating the dried brine sludge in a furnace in the temperature range of 800 to 1300° C. for a period of 1 to 2 hours.
 c) mechano-chemically processing the brine sludge obtained in step [b] by grinding with 20 g to 60 g of sodium hexametaphosphate in a ball mill or planetary mill etc. for a period of 1 to 6 hours to obtain the desired advanced non-toxic radiation shielding materials.
 d) compacting the advanced non-toxic radiation shielding materials obtained in step [c] in a steel mold, using hydraulic pressure in the range of 100 to 300 kg/cm$^2$ in the form of tiles.

In still another embodiment, the present invention provides tiles made from the developed advanced non-toxic radiation shielding materials wherein the dimensions of the tiles are preferably 10 cm×10 cm×5-10 mm.

In another embodiment, the present invention provides a process which encompasses the following major aspects:
 Preparation of advanced non-toxic radiation shielding materials utilizing tailored brine sludge.
 Mechano-chemical activation of heat treated brine sludge for obtaining tailored brine sludge for developing homogeneous advanced radiation shielding materials.
 Formation of desired shielding phases by chemical designing and mineralogically formulating compositions based on various chemical precursors inherently present in brine sludge.
 Developing of desired mineralogical phases necessary for obtaining uniform and homogenous advanced radiation shielding materials.
 Designing of raw materials and processing parameters, enabling synergistic and simultaneous chemical reactions among the various reactants of the designed mix of raw materials.
 Conversion of toxic elements like chromium, zinc, copper and vanadium, present in brine sludge into non-toxic form leading to development of non-toxic shielding phases.
 Conversion of toxic brine sludge waste material into highly value added advanced radiation shielding materials possessing homogeneous radiation shielding matrix.
 Total utilization of toxic brine sludge in making advanced non-toxic radiation shielding materials.
 Saving the cost by not requiring the addition of costly chemicals externally as they are inherently present in brine sludge for making advanced non-toxic radiation shielding materials.
 Solving the disposal problem of toxic brine sludge waste and to save the environment all over the world.

DETAILED DESCRIPTION OF THE INVENTION

In the process developed in the present invention, brine sludge was dried in an air oven and was reheat treated in a furnace in the temperature range of 800° C. to 1300° C. for a period of 1 to 2 hours. The heat treated brine sludge so obtained was further mechano-chemically processed by grinding with sodium hexametaphosphate in a ball mill or planetary mill etc. for a period of 1-6 hours. The tailored brine sludge powder thus obtained was further compacted in a steel mold, using hydraulic pressure in the range of 100-300 kg/cm$^2$ in the form of tiles of desired dimensions to make advanced non-toxic radiation shielding materials.

The process for the preparation of the aforesaid advanced non-toxic radiation shielding materials involves together drying of 200 g-600 g of brine sludge in an air oven at 100° C.-110° C. for a period of 1-2 hours followed by heating in a furnace in the temperature range of 800° C.-1300° C. for a period of 1-2 hours. The heat treated brine sludge so obtained was further mechano-chemically processed by grinding with 20 g-60 g of sodium hexametaphosphate in a ball mill or planetary mill etc. for a period of 1-6 hours and the tailored brine sludge powder so obtained was further compacted in a steel mold, using hydraulic pressure in the range of 100-300 kg/cm$^2$ in the form of tiles of dimensions 10 cm×10 cm×5-10 mm to make advanced non-toxic radiation shielding materials. The characteristics of the developed materials so obtained were tested for Impact strength and water absorption and x ray attenuation test.

SYNERGISM DATA: The table provided here as under depicts the synergism between the components of the claimed composition.

| Sl. no. | Components added [along with quantities] and parameters adopted | Impact Strength-kgfm · cm$^{-1}$ | Water absorption | X-ray attenuation test with standard filter at respective kV using narrow beam X-ray qualities at 250 kV with (3Pb + 2Sn + 2Al) filter, 200 kV with (1Pb + 2Cu + 3Sn + 2Al), at 150 kV with (2.5Sn + 2Al), and at 100 kV With (5Cu + 2Al) and the attenuation for various kV i.e. at 250, 200, 150 and 100 kV |
|---|---|---|---|---|
| 1 | drying of 200 g of brine sludge in an air oven at 100° C. for a period of 2 hours and followed by heating in a furnace at the temperature of 800° C. for a period of 2 hours and the heat treated brine sludge so obtained was further mechano-chemically processed by grinding with 20 g of sodium hexameta phosphate in a ball mill or planetary mill etc. for a period of 2 hours and the tailored brine sludge powder so obtained was further compacted in a steel mold, using hydraulic pressure in the range of 100 kg/cm$^2$ in the form of tiles of dimensions 10 cm × 10 cm × 5 mm to make advanced radiation shielding material. | 0.020 | 16 | 19, 25, 50 and 70% respectively. |
| 2 | drying of 500 g of brine sludge in an air oven at 100° C. for a period of 2 hours and followed by heating in a furnace at the temperature of 900° C. for a period of 2 hours and the heat treated brine sludge so obtained was further mechano-chemically processed by grinding with 50 g of sodium hexametaphosphate in a ball mill or planetary mill etc. for a period of 8 hours and the tailored brine sludge powder so obtained was further compacted in a steel mold, using hydraulic pressure in the range of 100 kg/cm$^2$ in the form of tiles of dimensions 10 cm × 10 cm × 9 mm to make advanced radiation shielding material. | 0.022 | 14 | 21, 29, 55 and 75% respectively. |
| 3 | drying of 300 g of brine sludge in an air oven at 100° C. for a period of 2 hours and followed by heating in a furnace at the temperature of 1000° C. for a period of 1 hour and the heat treated brine sludge so obtained was further mechano-chemically processed by grinding with 30 g of sodium hexametaphosphate in a ball mill or planetary mill etc. for a period of 3 hours and the tailored brine sludge powder so obtained was further compacted in a steel mold, using hydraulic pressure in the range of 100 kg/cm$^2$ in the form of tiles of dimensions 10 cm × 10 cm × 5 mm to make advanced radiation shielding material. | 0.025 | 12 | 24, 33, 60 and 80% respectively. |
| 4 | drying of 400 g of brine sludge in an air oven at 100° C. for a period of 2 hours and followed by heating in a furnace at the temperature of 1100° C. for a period of 1 hour and the heat treated brine sludge so obtained was further mechano-chemically processed by grinding with 40 g of sodium hexametaphosphate in a ball mill or planetary mill etc. for a period of 4 hours and the tailored brine sludge powder so obtained was further compacted in a steel mold, using hydraulic pressure in the range | 0.028 | 10 | 29, 38, 64 and 85% respectively. |

| | | | X-ray attenuation test with standard filter at respective kV using narrow beam X-ray qualities at 250 kV with (3Pb + 2Sn + 2Al) filter, 200 kV with (1Pb + 2Cu + 3Sn + 2Al), at 150 kV with (2.5Sn + 2Al), and at 100 kV With (5Cu + 2Al) |
|---|---|---|---|
| Sl. no. | Components added [along with quantities] and parameters adopted | Impact Strength- kgfm · cm$^{-1}$ | Water absorption | and the attenuation for various kV i.e. at 250, 200, 150 and 100 kV |
| | of 100 kg/cm$^2$ in the form of tiles of dimensions 10 cm × 10 cm × 8 mm to make advanced radiation shielding material. | | | |
| 5 | drying of 600 g of brine sludge in an air oven at 100° C. for a period of 2 hours and followed by heating in a furnace at the temperature of 1300° C. for a period of 1 hour and the heat treated brine sludge so obtained was further mechano-chemically processed by grinding with 60 g of sodium hexameta phosphate in a ball mill or planetary mill etc. for a period of 6 hours and the tailored brine sludge powder so obtained was further compacted in a steel mold, using hydraulic pressure in the range of 100 kg/cm$^2$ in the form of tiles of dimensions 10 cm × 10 cm × 10 mm to make advanced radiation shielding material. | 0.030 | 7 | 34, 43, 69 and 90% respectively. |

SYNERGISM DATA: The table provided here as under depicts the synergism between the components of the claimed composition.

EXAMPLES

The following examples are given by way of illustration and therefore should not be construed to limit the scope of the present invention in any manner.

Example 1

The process for making "advanced non-toxic radiation shielding materials" utilizing tailored brine sludge, comprises drying of 200 g of brine sludge in an air oven at 100° c. for a period of 2 hours followed by heating in a furnace at the temperature of 800° c. for a period of 2 hours. The heat treated brine sludge so obtained was further mechano-chemically processed by grinding with 20 g of sodium hexametaphosphate in a ball mill or planetary mill for a period of 2 hours and the tailored brine sludge powder so obtained was further compacted in a steel mold, using hydraulic pressure in the range of 100 kg/cm$^2$ in the form of tiles of dimensions 10 cm×10 cm×5 mm to obtain the desired advanced radiation shielding material.

The sample so prepared having 5 mm thickness was evaluated for its X-ray attenuation test with standard filter at respective kV using narrow beam X-ray qualities at 250 kV with (3Pb+2Sn+2Al) filter, 200 kV with (1Pb+2Cu+3Sn+2Al), at 150 kV with (2.5Sn+2Al), and at 100 kV With (5Cu+2Al) and the attenuation for various kV i.e. at 250, 200, 150 and 100 kV were found to be 19, 25, 50 and 70% respectively. The impact strength of the sample was found to be 0.020 kgfm·cm$^{-1}$ and water absorption in the range of 16.0%.

Example 2

The process for making "advanced non-toxic radiation shielding materials" utilizing tailored brine sludge, comprises drying of 500 g of brine sludge in an air oven at 100° c. for a period of 2 hours followed by heating in a furnace at the temperature of 900° c. for a period of 2 hours. The heat treated brine sludge so obtained was further mechano-chemically processed by grinding with 50 g of sodium hexametaphosphate in a ball mill or planetary mill for a period of 8 hours and the tailored brine sludge powder so obtained was further compacted in a steel mold, using hydraulic pressure in the range of 100 kg/cm$^2$ in the form of tiles of dimensions 10 cm×10 cm×9 mm to obtain the desired advanced radiation shielding material.

The sample so prepared having 9 mm thickness was evaluated for its X-ray attenuation test with standard filter at respective kV using narrow beam X-ray qualities at 250 kV with (3Pb+2Sn+2Al) filter, 200 kV with (1Pb+2Cu+3Sn+2Al), at 150 kV with (2.5Sn+2Al), and at 100 kV With (5Cu+2Al) and the attenuation for various kV i.e. at 250, 200, 150 and 100 kV were found to be 21, 29, 55 and 75% respectively. The impact strength of the sample was found to be 0.022 kgfm·cm$^{-1}$ and water absorption in the range of 14.0%.

Example 3

The process for making "advanced non-toxic radiation shielding materials" utilizing tailored brine sludge, comprises drying of 300 g of brine sludge in an air oven at 100° c. for a period of 2 hours followed by heating in a furnace at the temperature of 1000° c. for a period of 1 hour. The heat treated brine sludge so obtained was further mechano-chemically processed by grinding with 30 g of sodium hexametaphosphate in a ball mill or planetary mill for a period of 3 hours and the tailored brine sludge powder so obtained was further compacted in a steel mold, using hydraulic pressure in the range of 100 kg/cm$^2$ in the form of tiles of dimensions 10 cm×10 cm×5 mm to obtain the desired advanced radiation shielding material.

The sample so prepared having 5 mm thickness was evaluated for its X-ray attenuation test with standard filter at respective kV using narrow beam X-ray qualities at 250 kV with (3Pb+2Sn+2Al) filter, 200 kV with (1Pb+2Cu+3Sn+2Al), at 150 kV with (2.5Sn+2Al), and at 100 kV With (5Cu+2Al) and the attenuation for various kV i.e. at 250, 200, 150 and 100 kV were found to be 24, 33, 60 and 80% respectively. The impact strength of the sample was found to be 0.025 kgfm·cm$^{-1}$ and water absorption in the range of 12.0%.

Example 4

The process for making "advanced non-toxic radiation shielding materials" utilizing tailored brine sludge, comprises drying of 400 g of brine sludge in an air oven at 100° c. for a period of 2 hours followed by heating in a furnace at the temperature of 1100° c. for a period of 1 hour. The heat treated brine sludge so obtained was further mechano-chemically processed by grinding with 40 g of sodium hexametaphosphate in a ball mill or planetary mill for a period of 4 hours and the tailored brine sludge powder so obtained was further compacted in a steel mold, using hydraulic pressure in the range of 100 kg/cm$^2$ in the form of tiles of dimensions 10 cm×10 cm×8 mm to obtain the desired advanced radiation shielding material.

The sample so prepared having 8 mm thickness was evaluated for its X-ray attenuation test with standard filter at respective kV using narrow beam X-ray qualities at 250 kV with (3Pb+2Sn+2Al) filter, 200 kV with (1Pb+2Cu+3Sn+2Al), at 150 kV with (2.5Sn+2Al), and at 100 kV With (5Cu+2Al) and the attenuation for various kV i.e. at 250, 200, 150 and 100 kV were found to be 29, 38, 64 and 85% respectively. The impact strength of the sample was found to be 0.028 kgfm·cm$^{-1}$ and water absorption in the range of 10.0%.

Example 5

The process for making "advanced non-toxic radiation shielding materials" utilizing tailored brine sludge, comprises drying of 600 g of brine sludge in an air oven at 100° c. for a period of 2 hours followed by heating in a furnace at the temperature of 1300° c. for a period of 1 hour. The heat treated brine sludge so obtained was further mechano-chemically processed by grinding with 60 g of sodium hexametaphosphate in a ball mill or planetary mill for a period of 6 hours and the tailored brine sludge powder so obtained was further compacted in a steel mold, using hydraulic pressure in the range of 100 kg/cm$^2$ in the form of tiles of dimensions 10 cm×10 cm×10 mm to obtain the desired advanced radiation shielding material.

The sample so prepared having 10 mm thickness was evaluated for its X-ray attenuation test with standard filter at respective kV using narrow beam X-ray qualities at 250 kV with (3Pb+2Sn+2Al) filter, 200 kV with (1Pb+2Cu+3Sn+2Al), at 150 kV with (2.5Sn+2Al), and at 100 kV With (5Cu+2Al) and the attenuation for various kV i.e. at 250, 200, 150 and 100 kV were found to be 34, 43, 69 and 90% respectively. The impact strength of the sample was found to be 0.030 kgfm·cm$^{-1}$ and water absorption in the range of 7.0%.

ADVANTAGES OF THE INVENTION

The process involves mechano-chemical activation of heat treated brine sludge for obtaining tailored brine sludge useful for developing homogeneous advanced radiation shielding materials.

Obtaining shielding phases by chemical designing and mineralogically formulating compositions based on various precursors of chemicals present in brine sludge.

Developing desired mineralogical phases necessary for obtaining uniform and homogenous advanced radiation shielding materials.

Conversion of toxic elements like chromium, zinc, copper and vanadium, present in brine sludge into non-toxic form and leading to development of non-toxic shielding phases.

Conversion of toxic brine sludge waste material into highly value added advanced non-toxic radiation shielding materials possessing homogeneous radiation shielding matrix.

Total utilization of toxic brine sludge in making non-toxic and highly value added advanced materials thereby solving the disposal problem of toxic brine sludge waste.

We claim:

1. An advanced non-toxic radiation shielding material comprising:
   [a] 200 g to 600 g of brine sludge; and
   [b] 20 g to 60 g of sodium hexametaphosphate.

2. A process for an advanced non-toxic radiation shielding material comprising the steps of:
   [a] drying 200 g to 600 g of brine sludge in an air oven at a temperature of 100 to 110° C. for a period of 1 to 2 hours;
   [b] heating the dried brine sludge as obtained in step [a] in a furnace at a temperature ranging from 800 to 1300° C. for a period of 1 to 2 hours;
   [c] mechano-chemical processing of the heat treated brine sludge obtained in step [b] by grinding with 20 to 60 g of sodium hexametaphosphate in a ball mill or planetary mill for a period of 1 to 6 hours to obtain tailored brine sludge powder; and
   [d] compacting the tailored brine sludge powder obtained in step [c] in a steel mold using hydraulic pressure in a range of 100 to 300 kg/cm$^2$ in the form of tiles to obtain the desired advanced non-toxic radiation shielding material.

3. The process of claim 2, wherein the dimensions of the tiles are 10 cm×10 cm×5-10 mm.

* * * * *